United States Patent
Yeh et al.

(10) Patent No.: US 9,577,091 B2
(45) Date of Patent: Feb. 21, 2017

(54) VERTICAL TRANSISTOR AND MANUFACTURING METHOD THEREOF

(71) Applicant: E Ink Holdings Inc., Hsinchu (TW)

(72) Inventors: Chia-Chun Yeh, Hsinchu (TW);
Wei-Tsung Chen, Hsinchu (TW);
Cheng-Hang Hsu, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/194,824

(22) Filed: Mar. 3, 2014

(65) Prior Publication Data

US 2015/0076588 A1    Mar. 19, 2015

(30) Foreign Application Priority Data

Sep. 13, 2013    (TW) .............................. 102133191 A

(51) Int. Cl.
| | | |
|---|---|---|
| *H01L 29/66* | (2006.01) | |
| *H01L 29/78* | (2006.01) | |
| *H01L 51/05* | (2006.01) | |
| *H01L 29/732* | (2006.01) | |

(52) U.S. Cl.
CPC ..... *H01L 29/7827* (2013.01); *H01L 29/66666* (2013.01); *H01L 51/055* (2013.01); *H01L 51/057* (2013.01); *H01L 29/66234* (2013.01); *H01L 29/66272* (2013.01); *H01L 29/732* (2013.01); *H01L 2251/305* (2013.01)

(58) Field of Classification Search
CPC ....................... H01L 29/66666; H01L 29/7827
USPC ......................................... 257/329; 438/268
See application file for complete search history.

(56) References Cited

U.S. PATENT DOCUMENTS

| | | | |
|---|---|---|---|
| 6,303,410 B1 * | 10/2001 | Baliga | H01L 29/66348 257/E21.384 |
| 2007/0080385 A1 | 4/2007 | Kim et al. | |
| 2009/0242979 A1 | 10/2009 | Hong et al. | |
| 2010/0301410 A1 * | 12/2010 | Hirler | H01L 29/7813 257/334 |

FOREIGN PATENT DOCUMENTS

| | | |
|---|---|---|
| TW | 463295 B | 11/2001 |
| TW | 200419805 A | 10/2004 |
| TW | 200810089 A | 2/2008 |

OTHER PUBLICATIONS

Corresponding Taiwanese Office Action that these art references were cited on Aug. 4, 2015.

\* cited by examiner

*Primary Examiner* — Jamie C Niesz
(74) *Attorney, Agent, or Firm* — CKC & Partners Co., Ltd.

(57) ABSTRACT

A vertical transistor and a manufacturing method thereof are provided herein. The manufacturing method includes forming a first patterned conductive layer on a substrate; forming a patterned metal oxide layer on the first patterned conductive layer, in which the patterned metal oxide layer includes a first patterned insulator layer, a second patterned insulator layer, and a second patterned conductive layer; forming a semiconductor layer; and forming a third patterned conductive layer. The first patterned insulator layer, the second patterned insulator layer, and the second patterned conductive layer are made by using a single metal oxide material. The oxygen concentration of the second patterned conductive layer is different from the oxygen concentrations of the first patterned insulator layer and the second patterned insulator layer.

1 Claim, 9 Drawing Sheets

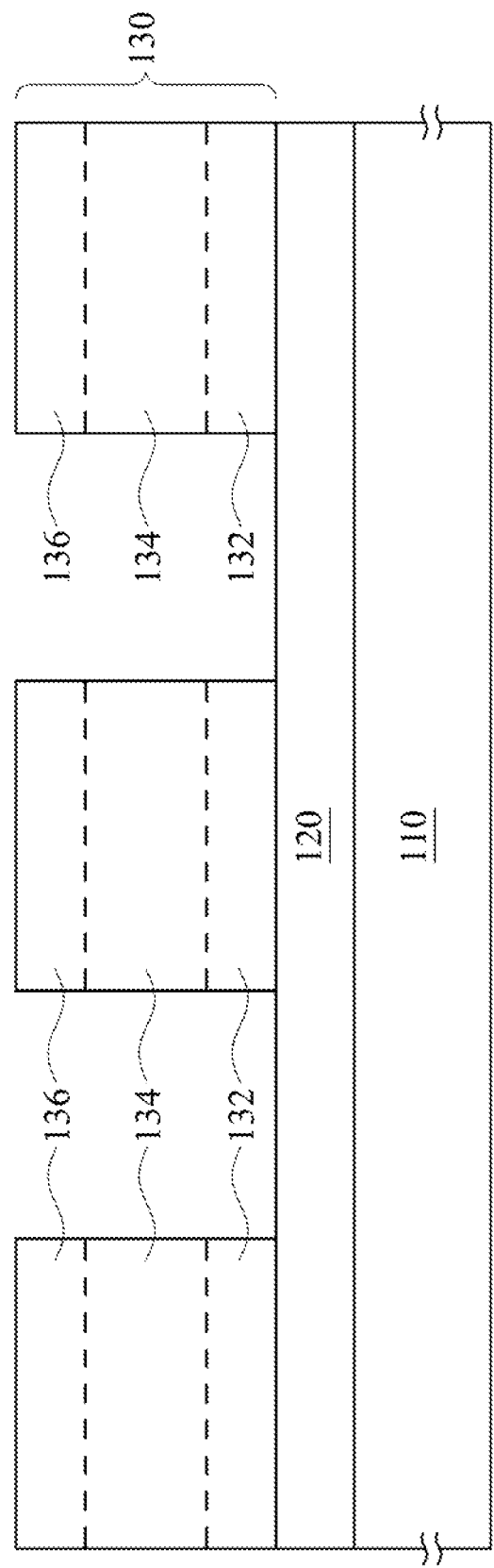

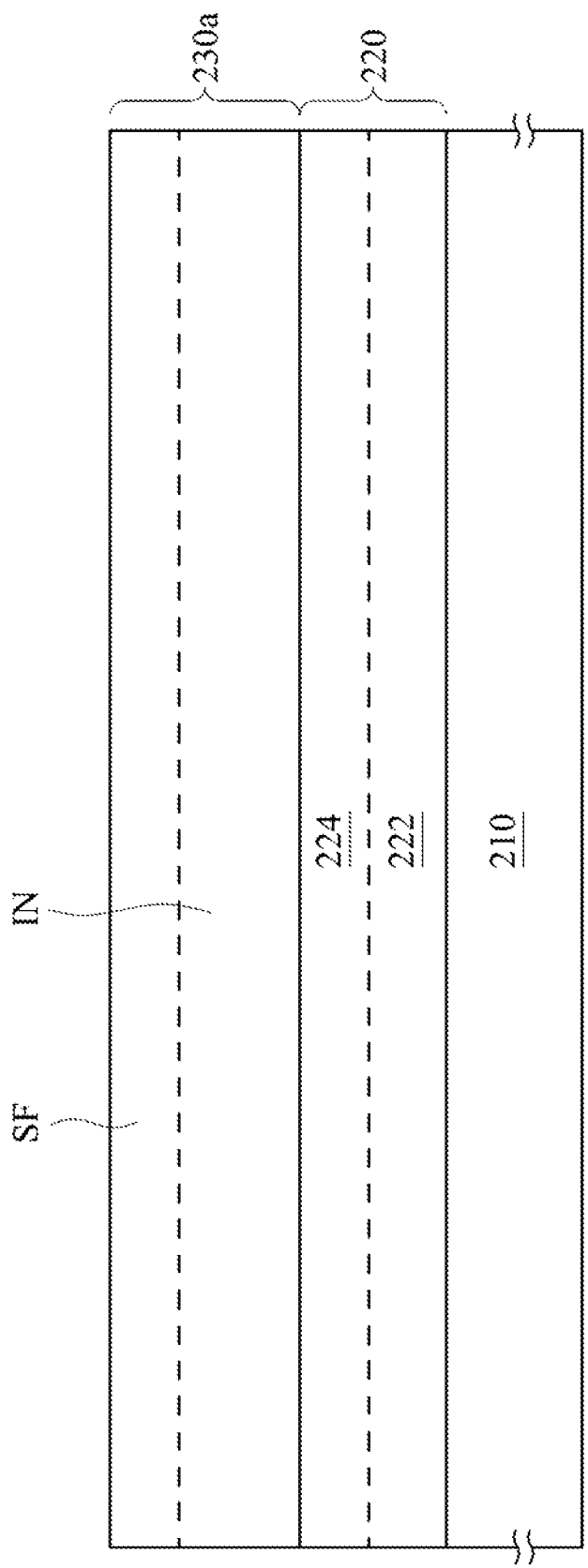

VERTICAL TRANSISTOR AND MANUFACTURING METHOD THEREOF

RELATED APPLICATIONS

This application claims priority to Taiwanese Application Serial Number 102133191, filed Sep. 13, 2013, which is herein incorporated by reference.

BACKGROUND

Field of Invention

The present invention relates to an electronic element and a manufacturing method thereof. More particularly, the present invention relates to a vertical transistor and a manufacturing method thereof.

Description of Related Art

With advances in electronic technology, transistors are widely used in various kinds of electronic devices, such as computers, mobile phones, and displays.

In the manufacturing process of a typical planar transistor, it is not possible to further shrink the channel length of the planar transistor due to limitations encountered with respect to the capability of the manufacturing machine. The channel length corresponds to the characteristic of the planar transistor, such as drive current. The shorter the channel length, the higher the drive current. When the channel length cannot be further shrunk, it is not possible to realize additional improvements in the capability of the transistor, such that the development of the device using the transistor is also restricted.

Thus, further shrinking the channel length of the transistor to improve the characteristic thereof is an important area of research in this field.

SUMMARY

One aspect of the present disclosure is related to a manufacturing method of a vertical transistor. In accordance with one embodiment of the present disclosure, the manufacturing method includes forming a first patterned conductive layer on a substrate; forming a patterned metal oxide layer on the first patterned conductive layer, in which the patterned metal oxide layer comprises a first patterned insulator layer, a second patterned insulator layer, and a second patterned conductive layer, and the second patterned conductive layer is interposed between the first patterned insulator layer and the second patterned insulator layer; forming a semiconductor layer; and forming a third patterned conductive layer, in which the semiconductor layer is interposed between the first patterned conductive layer and the third patterned conductive layer. The first patterned insulator layer, the second patterned insulator layer, and the second patterned conductive layer are made by using a single metal oxide material, and the oxygen concentration of the second patterned conductive layer is different from the oxygen concentrations of the first patterned insulator layer and the second patterned insulator layer.

In accordance with one embodiment of the present disclosure, the step of forming the patterned metal oxide layer on the first patterned conductive layer includes forming a first insulator material layer on the first patterned conductive layer in a first flow rate of oxygen; forming a conducting material layer on the first insulator material layer in a second flow rate of oxygen; forming a second insulator material layer on the conducting material layer in a third flow rate of oxygen, in which the second flow rate of oxygen is different from the first flow rate of oxygen and the third flow rate of oxygen; and patterning the first insulator material layer, the conducting material layer, and the second insulator material layer, so as to respectively form the first patterned insulator layer, the second patterned conductive layer, and the second patterned insulator layer.

In accordance with one embodiment of the present disclosure, the oxygen concentration of the second patterned conductive layer is lower than the oxygen concentrations of the first patterned insulator layer and the second patterned insulator layer.

In accordance with one embodiment of the present disclosure, the oxygen concentration of the second patterned conductive layer is substantially between 0% and 2%, and the oxygen concentrations of the first patterned insulator layer and the second patterned insulator layer are substantially greater than 5%.

Another aspect of the present disclosure is related to a vertical transistor. In accordance with one embodiment of the present disclosure, the vertical transistor includes a substrate, a first patterned conductive layer, a patterned metal oxide layer, a semiconductor layer, and a third patterned conductive layer. The first patterned conductive layer is formed on the substrate. The patterned metal oxide layer is formed on the first patterned conductive layer. The patterned metal oxide layer includes a first patterned insulator layer, a second patterned insulator layer, and a second patterned conductive layer, and the second patterned conductive layer is interposed between the first patterned insulator layer and the second patterned insulator layer. The semiconductor layer is interposed between the first patterned conductive layer and the third patterned conductive layer. The first patterned insulator layer, the second patterned insulator layer, and the second patterned conductive layer are made by using a single metal oxide material, and the oxygen concentration of the second patterned conductive layer is different from the oxygen concentrations of the first patterned insulator layer and the second patterned insulator layer.

In accordance with one embodiment of the present disclosure, the oxygen concentration of the second patterned conductive layer is lower than the oxygen concentrations of the first patterned insulator layer and the second patterned insulator layer.

In accordance with one embodiment of the present disclosure, the oxygen concentration of the second patterned conductive layer is substantially between 0% and 2%, and the oxygen concentrations of the first patterned insulator layer and the second patterned insulator layer are substantially greater than 5%.

Another aspect of the present disclosure is related to a manufacturing method of a vertical transistor. In accordance with one embodiment of the present disclosure, the manufacturing method includes forming a patterned metal oxide layer on a substrate, in which the patterned metal oxide layer includes a first patterned conductive layer and a first patterned insulator layer; forming a patterned metal layer on the first patterned insulator layer, in which the patterned metal layer includes a second patterned conductive layer and a second patterned insulator layer, the second patterned conductive layer is located on the first patterned insulator layer, and the second patterned insulator layer is located on the second patterned conductive layer; forming a semiconductor layer; and forming a third patterned conductive layer, in which the semiconductor layer is interposed between the patterned metal oxide layer and the third patterned conductive layer. The first patterned conductive layer and the first patterned insulator layer are made by using a single metal oxide material, and the oxygen concentration of the first patterned conductive layer is different from the oxygen concentration of the first patterned insulator layer.

In accordance with one embodiment of the present disclosure, the step of forming the patterned metal oxide layer on the substrate includes forming a conductive material layer on the substrate in a first flow rate of oxygen; forming an insulator material layer on the conductive material layer in a second flow rate of oxygen, in which the second flow rate of oxygen is different from the first flow rate of oxygen; and patterning the conductive material layer and the insulator material layer, so as to respectively form the first patterned conductive layer and the first patterned insulator layer.

In accordance with one embodiment of the present disclosure, the oxygen concentration of the first patterned conductive layer is lower than the oxygen concentration of the first patterned insulator layer.

In accordance with one embodiment of the present disclosure, the oxygen concentration of the first patterned conductive layer is substantially between 0% and 2%, and the oxygen concentration of the first patterned insulator layer are substantially greater than 5%.

In accordance with one embodiment of the present disclosure, the step of forming the patterned metal layer includes forming a metal material layer on the first patterned insulator layer; patterning the metal material layer, so as to form the second patterned conductive layer, and expose a corresponding region of the first patterned insulator layer; passivating a surface layer of the patterned metal material layer, so as to form the second patterned insulator layer; and decreasing the oxygen concentration of the corresponding region of the first patterned insulator layer during the process of patterning the metal material layer and/or during the process of passivating the surface layer of the patterned metal material layer.

In accordance with one embodiment of the present disclosure, the step of patterning the metal material layer includes dry-etching the metal material layer and decreasing the oxygen concentration of the corresponding region of the first patterned insulator layer during the process of dry-etching the metal material layer.

In accordance with one embodiment of the present disclosure, the step of passivating the surface layer of the patterned metal material layer includes nitriding the surface layer of the patterned metal material layer and decreasing the oxygen concentration of the corresponding region of the first patterned insulator layer during the process of nitriding the surface layer of the patterned metal material layer.

In accordance with one embodiment of the present disclosure, the step of forming the patterned metal layer includes forming a metal material layer on the first patterned insulator layer; passivating a surface layer of the metal material layer; patterning the metal material layer having the passivated surface layer, so as to form the second patterned conductive layer and the second patterned insulator layer and expose a corresponding region of the first patterned insulator layer; and decreasing the oxygen concentration of the corresponding region of the first patterned insulator layer during the process of patterning the metal material layer.

In accordance with one embodiment of the present disclosure, the step of patterning the metal material layer having the passivated surface layer includes dry-etching the metal material layer having the passivated surface layer and decreasing the oxygen concentration of the corresponding region of the first patterned insulator layer during the process of dry-etching the metal material layer having the passivated surface layer.

Another aspect of the present disclosure is related to a vertical transistor. In accordance with one embodiment of the present disclosure, the vertical transistor includes a patterned metal oxide layer, a patterned metal layer, a semiconductor layer, and a third patterned conductive layer. The patterned metal oxide layer is formed on a substrate. The patterned metal oxide layer includes a first patterned conductive layer and a first patterned insulator layer. The patterned metal layer is formed on the first patterned insulator layer. The patterned metal layer includes a second patterned conductive layer and a second patterned insulator layer. The second patterned conductive layer is located on the first patterned insulator layer. The second patterned insulator layer is located on the second patterned conductive layer. The semiconductor layer is interposed between the patterned metal oxide layer and the third patterned conductive layer. The first patterned conductive layer and the first patterned insulator layer are made by using a single metal oxide material, and the oxygen concentration of the first patterned conductive layer is different from the oxygen concentration of the first patterned insulator layer.

In accordance with one embodiment of the present disclosure, the oxygen concentration of the first patterned conductive layer is lower than the oxygen concentration of the first patterned insulator layer.

In accordance with one embodiment of the present disclosure, the oxygen concentration of the first patterned insulator layer is substantially greater than 5%, and the oxygen concentration of the first patterned conductive layer is substantially between 0% and 2%.

In accordance with one embodiment of the present disclosure, the patterned metal oxide layer further includes an extended conductive layer. The extended conductive layer is formed on the first patterned conductive layer and contacted with the first patterned insulator layer. The extended conductive layer, the first patterned conductive layer and the first patterned insulator layer are made by using the same metal oxide material, and the concentration of the extended conductive layer is lower than the concentration of the first patterned insulator layer.

Through an application of one embodiment described above, a vertical transistor can be realized. The channel length of the vertical transistor (e.g., the interval between the first patterned conductive layer and the third patterned conductive layer) is determined by the thickness of the semiconductor layer, instead of by the capability of the manufacturing machine. Thus, the channel length of the vertical transistor can be effectively shrunk. In addition, because metal oxide may be a conductor or an insulator depending on the oxygen concentration thereof, the manufacturing process of the vertical transistor can be simplified through fabrication of the conductive layers and the insulating layers of the vertical transistor using the same metal oxide material with different oxygen concentrations. Hence, manufacture of the vertical transistor is made more efficient.

BRIEF DESCRIPTION OF THE DRAWINGS

The invention can be more fully understood by reading the following detailed description of the embodiment, with reference made to the accompanying drawings as follows:

FIGS. 1a to 1c illustrate a manufacturing procedure of a vertical transistor in accordance with a first embodiment of the present disclosure;

FIGS. 2a to 2d illustrate a manufacturing procedure of a vertical transistor in accordance with a second embodiment of the present disclosure.

DETAILED DESCRIPTION

Figure 1A:
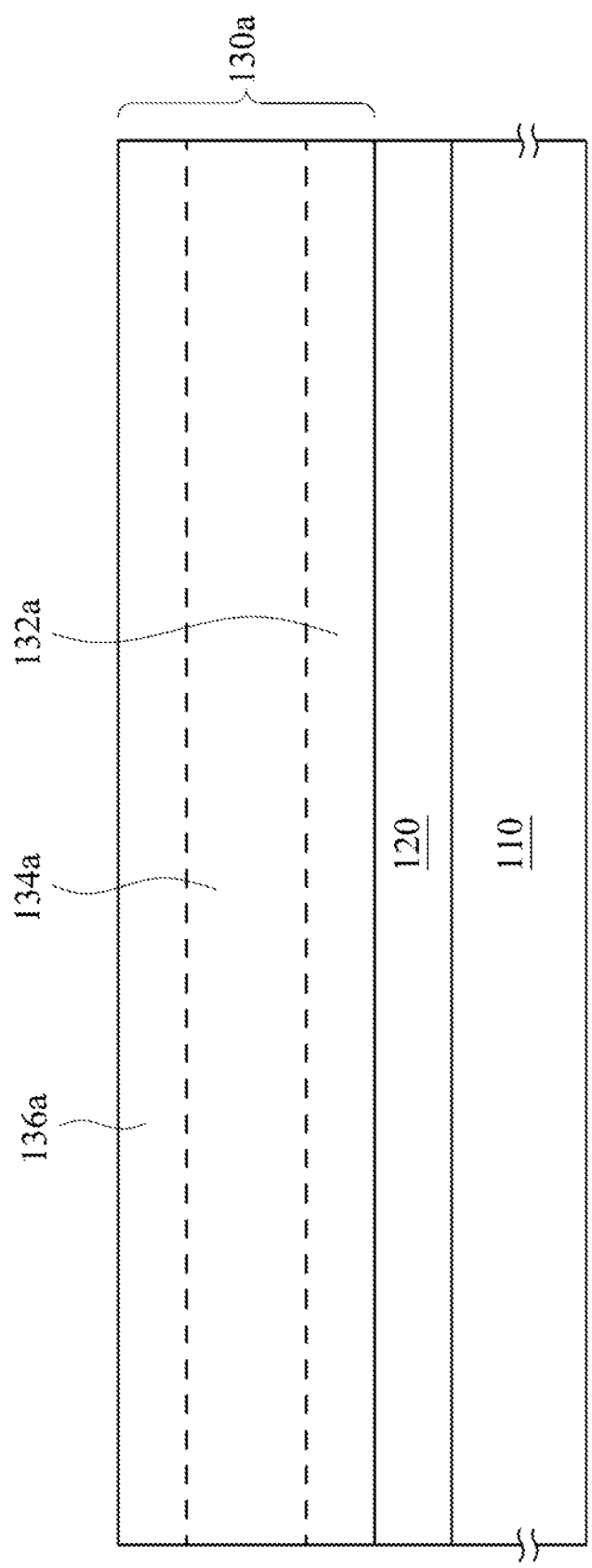

Reference will now be made in detail to the present embodiments of the invention, examples of which are illustrated in the accompanying drawings. Wherever possible, the same reference numbers are used in the drawings and the description to refer to the same or like parts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

It will be understood that words indicating direction used in the description of the following embodiments, such as "above," "below," "left," "right," "front" and "back," are directions as they relate to the accompanying drawings. Therefore, such words indicating direction are used for illustration and do not limit the invention.

It will be understood that when an element or layer is referred to as being "on," "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. It is further noted that like numbers refer to like elements throughout.

It will be understood that the phrase "and/or" includes any and all combinations of one or more of the associated listed items.

It will be understood that all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

One aspect of the present disclosure is a manufacturing method of a vertical transistor. The aspect includes a first embodiment, a second embodiment, and a third embodiment described below, but is not limited to these embodiments.

First Embodiment

Figure 1C:
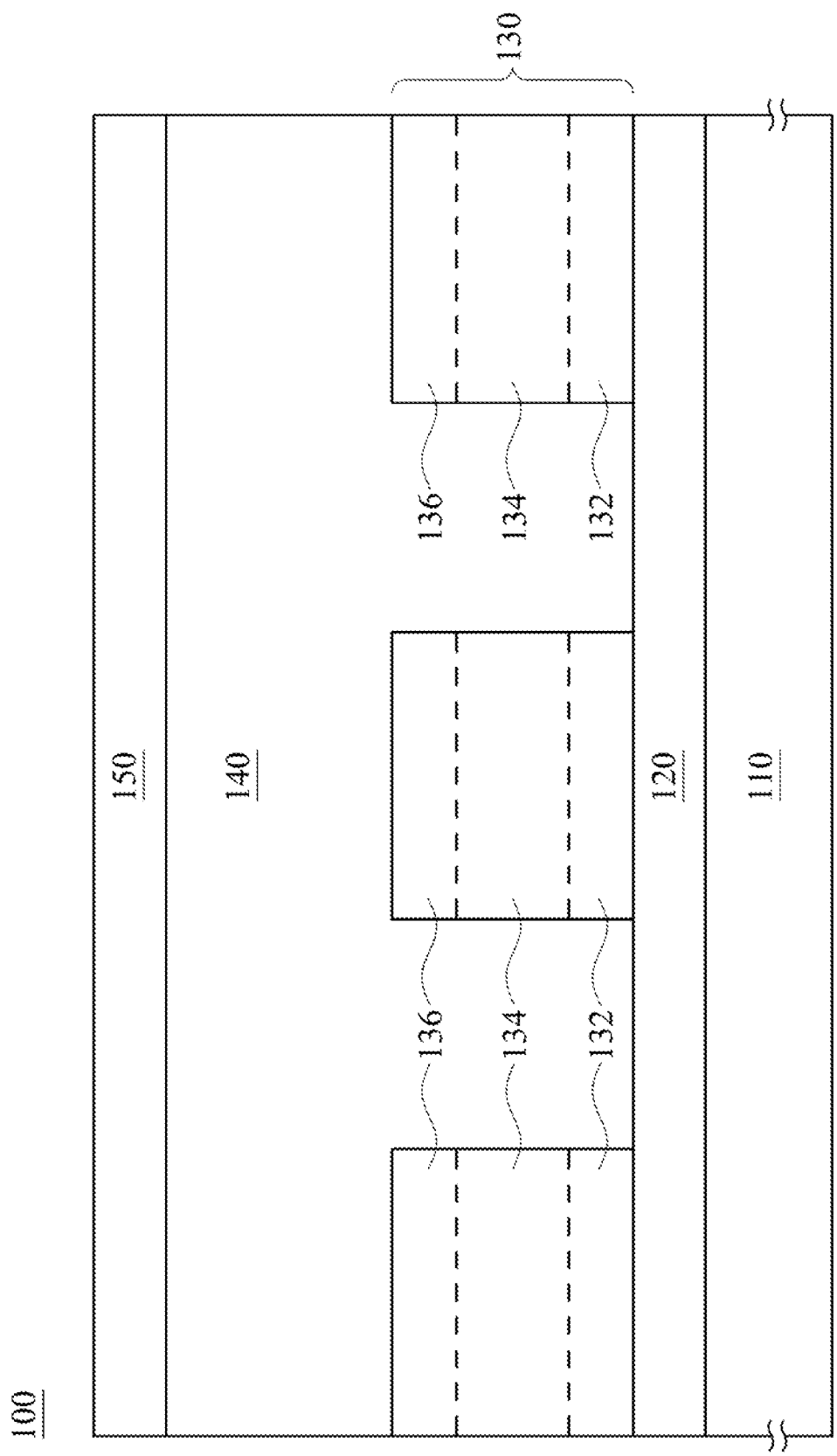

FIGS. 1a to 1c illustrate a manufacturing procedure of a vertical transistor 100 in accordance with a first embodiment of the present disclosure. As shown in FIG. 1a, in a first step, a first patterned conductive layer 120 is formed on a substrate 110. The first patterned conductive layer 120 may include an emitter electrode of the vertical transistor 100. The substrate 110 may be a rigid substrate or a flexible substrate. The rigid substrate may be made by using, for example, glass, quartz, or a silicon wafer. The flexible substrate may be made by using, for example, plastic, metal foil or paper. The first patterned conductive layer 120 may be made by using metal, composite metal, transparent conductive oxide, conducting polymer, and/or another suitable conducting material. The first patterned conductive layer 120 may be made by using a physical vapor deposition (PVD) process or using a printing process, such as screen printing, inject printing, and so on.

Subsequently, as shown in FIGS. 1a and 1b, in a second step, a patterned metal oxide layer 130 is formed on the first patterned conductive layer 120. The patterned metal oxide layer 130 includes a first patterned insulator layer 132, a second patterned conductive layer 134, and a second patterned insulator layer 136. The first patterned insulator layer 132 may include a first insulator layer of a base electrode of the vertical transistor 100, in which the first insulator layer is located under the base electrode of the vertical transistor 100. The second patterned conductive layer 134 may include the base electrode of the vertical transistor 100. The second patterned insulator layer 136 may include a second insulator layer of the base electrode of the vertical transistor 100, in which the second insulator layer is located on the base electrode of the vertical transistor 100.

In this embodiment, the step of forming the patterned metal oxide layer 130 may include two steps. First, with reference to FIG. 1a, a metal oxide material layer 130a is formed on the first patterned conductive layer 120. The metal oxide material layer 130a includes a first insulator material layer 132a, a conductive material layer 134a, and a second insulator material layer 136a. Subsequently, with reference to FIG. 1b, the first insulator material layer 132a, the conducting material layer 134a, and the second insulator material layer 136a are patterned, so as to respectively form the first patterned insulator layer 132, the second patterned conductive layer 134, and the second patterned insulator layer 136. The metal oxide material layer 130a may be made by using a PVD process. The patterned metal oxide layer 130 may be made by patterning the metal oxide material layer 130a using lithography and etching processes.

Because metal oxide material may be a insulator when it has a high oxygen concentration and an conductor when it has a low oxygen concentration, the first insulator material layer 132a, the conductive material layer 134a, and the second insulator material layer 136a of the metal oxide material layer 130a can be continuously formed (e.g., deposited) by simply varying the flow rate of oxygen during the manufacturing process of the metal oxide material layer 130a. Hence, the manufacturing process of the vertical transistor 100 can be simplified.

In one embodiment, the first insulator material layer 132a is formed on the first patterned conductive layer 120 under a condition of a first flow rate of oxygen (e.g., a high flow rate of oxygen in which the oxygen density is substantially greater than 5%). The second conductive material layer 134a is formed on the first insulator material layer 132a under a condition of a second flow rate of oxygen (e.g., a low flow rate of oxygen in which the oxygen density is substantially between 0% to 2%). The second insulator material layer 136a is formed on the second conductive material layer 134a under a condition of a third flow rate of oxygen (e.g., a high flow rate of oxygen in which the oxygen density may be the same as the first flow rate of oxygen).

Hence, all of the first patterned insulator layer 132, the second patterned conductive layer 134, and the second patterned insulator layer 136 are made by using the same metal oxide material (i.e., a single metal oxide material). The oxygen concentration of the second patterned conductive layer 134 is different from the oxygen concentrations of the first patterned insulator layer 132 and the second patterned insulator layer 136. That is, the oxygen concentration of the second patterned conductive layer 134 is lower than the oxygen concentrations of the first patterned insulator layer 132 and the second patterned insulator layer 136.

In one embodiment, when all of the first patterned insulator layer 132, the second patterned conductive layer 134, and the second patterned insulator layer 136 are made by using indium gallium zinc oxide (IGZO), the oxygen concentrations of the first patterned insulator layer 132 and the second patterned insulator layer 136 are substantially greater than 5%, and the oxygen concentration of the second patterned conductive layer 134 is substantially between 0% to 2%.

It should be noted that, other than using IGZO described above, in some embodiments, the first patterned insulator layer 132, the second patterned conductive layer 134, and the second patterned insulator layer 136 may also be made by using indium zinc oxide (IZO), zinc oxide (ZnO) or another metal oxide material.

Subsequently, as shown in FIG. 1c, in a third step, a semiconductor layer 140 is formed on the first patterned conductive layer 120 and the second patterned insulator layer 136 to serve as a semiconductor channel of the vertical transistor 100. The semiconductor layer 140 may be made by using an organic semiconductor, such as organic small molecules, organic polymers, or a mixture thereof.

Subsequently, in a fourth step, a third patterned conductive layer 150 is formed on the semiconductor layer 140, such that the semiconductor layer 140 is interposed between the first patterned conductive layer 120 and the third patterned conductive layer 150. The third patterned conductive layer 150 may include a collector electrode of the vertical transistor 100. The third patterned conductive layer 150 may be made by using metal, composite metal, transparent conductive oxide, conducting polymer, and/or another suitable conducting material. In addition, the third patterned conductive layer 150 may be made by using a PVD process or using a printing process, such as screen printing, inject printing, and so on.

Through the manufacturing method described above, the vertical transistor 100 can be realized. Compared to a planar transistor, the channel length of the vertical transistor 100 (e.g., the interval between the first patterned conductive layer 120 and the third patterned conductive layer 150) is determined by the thickness of the semiconductor layer 140, instead of by the capability of the manufacturing machine. Thus, the channel length of the vertical transistor 100 can be effectively shrunk. In addition, compared to some approaches where the first insulator material layer 132a, the conductive material layer 134a, and the second insulator material layer 136a are formed by using different materials, the manufacturing process of the vertical transistor 100 can be simplified through continuously forming the first insulator material layer 132a, the conductive material layer 134a, and the second insulator material layer 136a by using the same material of metal oxide with different oxygen concentrations. Hence, the efficiency of manufacturing the vertical transistor 100 can be increased.

Second Embodiment

Figure 2B:
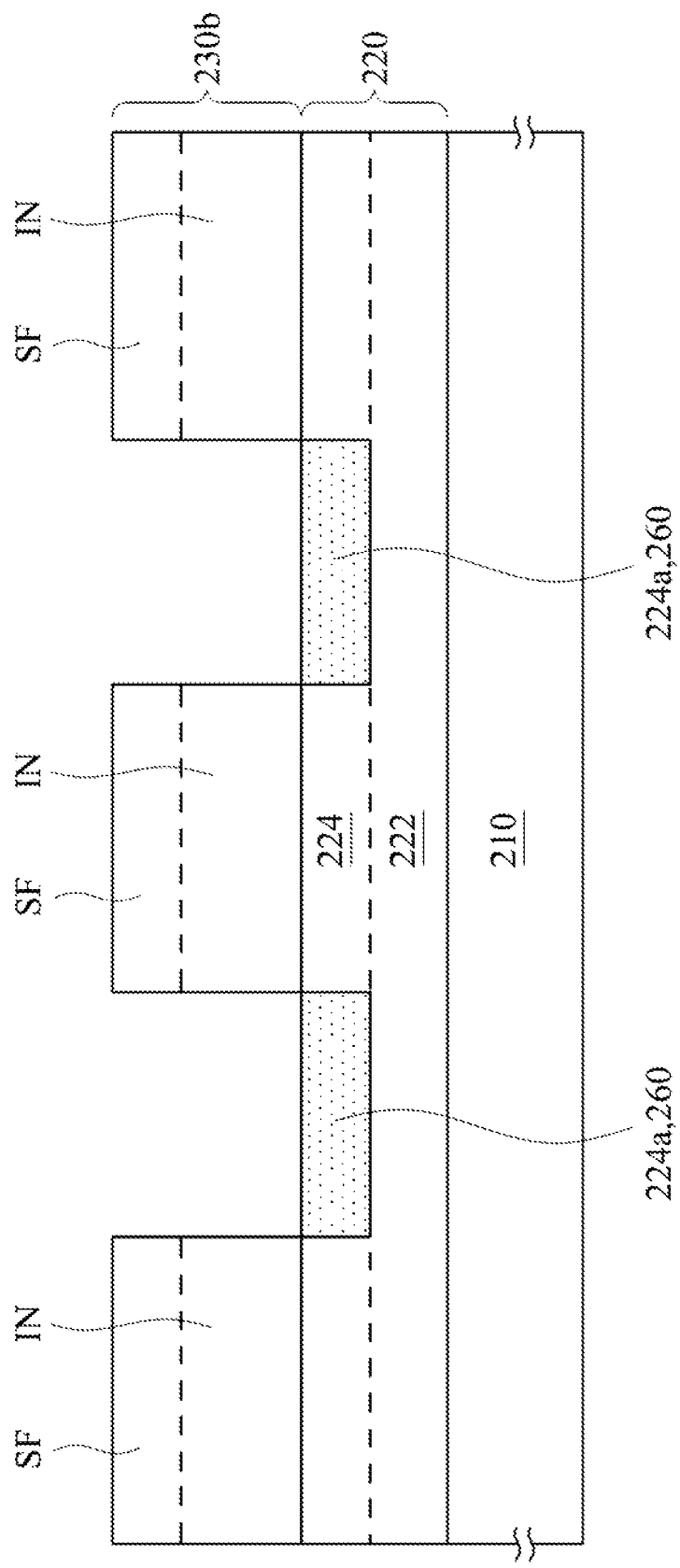

FIGS. 2a to 2d illustrate a manufacturing procedure of a vertical transistor 200 in accordance with a second embodiment of the present disclosure. As shown in FIG. 2a, in a first step, a patterned metal oxide layer 220 is formed on a substrate 210. The patterned metal oxide layer 220 includes a first patterned conductive layer 222 and a first patterned insulator layer 224. The first patterned conductive layer 222 may include an emitter electrode of the vertical transistor 200. The first patterned insulator layer 224 may include a first insulator layer of a base electrode of the vertical transistor 200, in which the first insulator layer is located under the base electrode of the vertical transistor 200.

In this embodiment, the step of forming the patterned metal oxide layer 220 may include two steps. First, a metal oxide material layer is formed on the substrate 210. The metal oxide material layer includes a conductive material layer and an insulator material layer. Subsequently, the conductive material layer and the insulator material layer of the metal oxide material layer are patterned so as to respectively form the first patterned conductive layer 222 and the first patterned insulator layer 224. The metal oxide material layer may be made by using a PVD process. The patterned metal oxide layer 220 may be made by patterning the metal oxide material layer using lithography and etching processes.

Because metal oxide material may be an insulator when it has a high oxygen concentration and an conductor when it has a low oxygen concentration, the conductive material layer and the insulator material layer of the metal oxide material layer can be continuously formed (e.g., deposited) by simply varying the flow rate of oxygen during the manufacturing process of the metal oxide material layer. Hence, the manufacturing process of the vertical transistor 200 can be simplified.

In one embodiment, the conductive material layer is formed on the substrate 210 under a condition of a first flow rate of oxygen (e.g., a low flow rate of oxygen in which the oxygen density is substantially between 0% to 2%). The insulator material layer is formed on the conductive material layer under a condition of a second flow rate of oxygen (e.g., a high flow rate of oxygen in which the oxygen density is substantially greater than 5%).

Hence, both of the first patterned conductive layer 222 and the first patterned insulator layer 224 are made by using the same metal oxide material. The oxygen concentration of the first patterned conductive layer 222 is different from the oxygen concentration of the first patterned insulator layer 224. That is, the oxygen concentration of the first patterned conductive layer 222 is lower than the oxygen concentration of the first patterned insulator layer 224.

In one embodiment, when both of the first patterned conductive layer 222 and the first patterned insulator layer 224 are made by using IGZO, the oxygen concentration of the first patterned conductive layer 222 is substantially between 0% to 2%, and the oxygen concentration of the first patterned insulator layer 224 is substantially greater than 5%.

It should be noted that, other than using IGZO described above, in some embodiments, the first patterned conductive layer 222 and the first patterned insulator layer 224 may also be made by using IZO, ZnO or another metal oxide material.

Figure 2C:
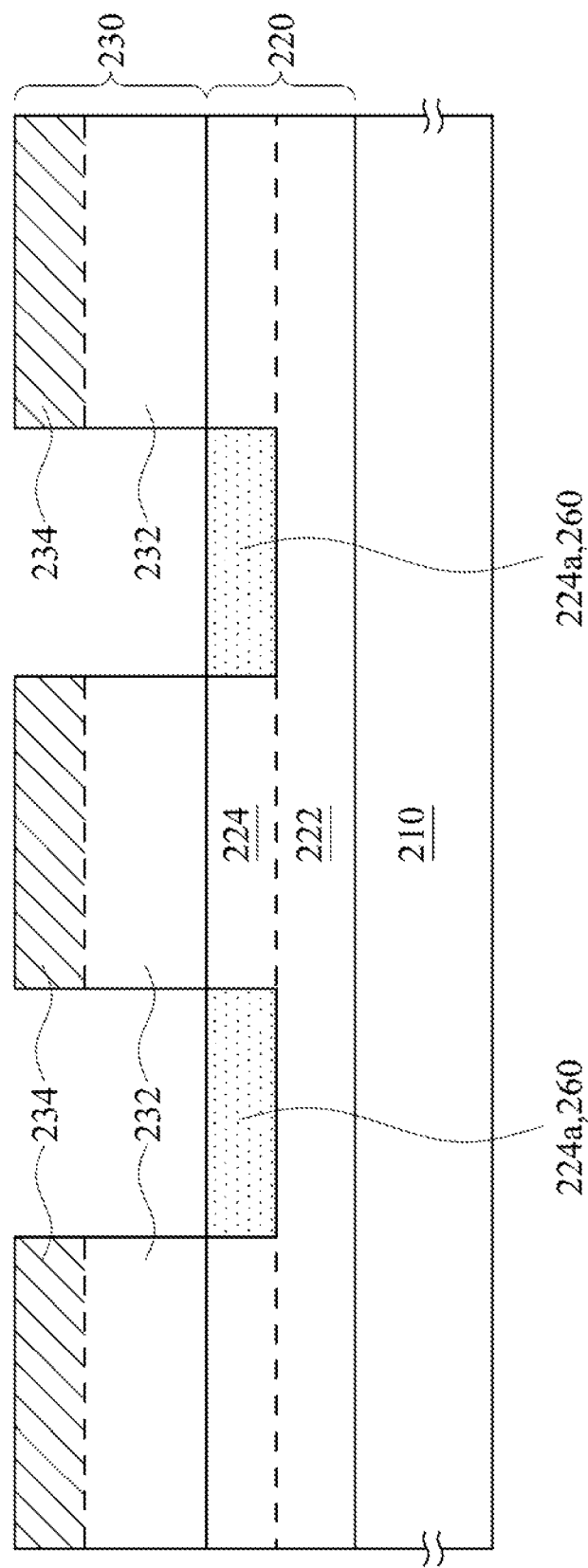

Subsequently, as shown in FIG. 2a to 2c, in a second step, a patterned metal layer 230 is formed on the first patterned insulator layer 224. The patterned metal layer 230 includes a second patterned conductive layer 232 and a second patterned insulator layer 234. The second patterned conductive layer 232 is located on the first patterned insulator layer 224. The second patterned insulator layer 234 is located on the second patterned conductive layer 232.

In this embodiment, the second patterned conductive layer 232 may include the base electrode of the vertical electrode 200. The second patterned insulator layer 234 may include a second insulator layer of the base electrode of the vertical electrode 200, in which the second insulator layer is located on the base electrode.

More specifically, in this embodiment, the step of forming the patterned metal layer 230 may include three sub-steps.

Referring to FIG. 2a, in a first sub-step, a metal material layer 230a is formed on the first patterned insulator layer 224. The metal material layer 230a includes a surface layer SF and an inner layer IN. The metal material layer 230a may be made by using a PVD process.

Subsequently, referring to FIG. 2b, in a second sub-step, the metal material layer 230a is patterned to form a patterned metal material layer 230b and expose a corresponding region 224a of the first patterned insulator layer 224. At this time, the inner layer IN of the patterned metal material layer 230b becomes the second patterned conductive layer 232. The metal material layer 230a may be patterned using lithography and etching processes.

Next, referring to FIG. 2c, in a third sub-step, the surface layer SF of the patterned metal material layer 230b is passivated, so as to form the second patterned insulator layer 234. The surface layer SF of the patterned metal material layer 230b may be passivated using, for example, a nitriding or oxidizing process.

In this embodiment, during the process of the second sub-step and/or the third sub-step described above, the oxygen concentration of the corresponding region 224a of the first patterned insulator layer 224 can be decreased, such that the corresponding region 224a of the first patterned insulator layer 224 can be converted from an insulator to a conductor and becomes an extended conductive layer 260 of the patterned metal oxide layer 220.

For example, in the second sub-step described above, the metal material layer 230a may be dry-etched by plasma. During the process of dry-etching the metal material layer 230a, the oxygen concentration of the corresponding region 224a of the first patterned insulator layer 224 is decreased by the plasma, such that the corresponding region 224a of the first patterned insulator layer 224 is converted from an insulator to a conductor and becomes the extended conductive layer 260.

As another example, in the third sub-step described above, the surface layer SF of the patterned metal material layer 230b may be nitrided. During the process of nitriding the surface layer SF of the patterned metal material layer 230b, the oxygen concentration of the corresponding region 224a of the first patterned insulator layer 224 is decreased, such that the corresponding region 224a of the first patterned insulator layer 224 is converted from an insulator to a conductor and becomes the extended conductive layer 260.

It should be noted that, in one embodiment, the metal material layer 230a may be dry-etched by plasma at first, and the surface layer SF of the patterned metal material layer 230b may be nitrided subsequently, such that the oxygen concentration of the corresponding region 224a of the first patterned insulator layer 224 can be decreased significantly.

In addition, since the extended conductive layer 260 is converted from the corresponding region 224a of the first patterned insulator layer 224, the extended conductive layer 260 can also be regarded as being formed on the first patterned conductive layer 222, and be contacted with the first patterned insulator layer 224. The extended conductive layer 260, the first patterned conductive layer 222 and the first patterned insulator layer 224 are made by using the same metal oxide material. The concentration of the extended conductive layer 260 is lower than the concentration of the first patterned insulator layer 224.

Subsequently, referring to FIG. 2d, in a third step, the semiconductor layer 240 is formed on the extended conductive layer 260 of the patterned metal oxide layer 220 and the second patterned conductive layer 234, to serve as a semiconductor channel of the vertical transistor 200. Subsequently, in a fourth step, a third patterned conductive layer 250 is formed on the semiconductor layer 240, such that the semiconductor layer 240 is interposed between the patterned metal oxide layer 220 and the third patterned conductive layer 250. The third patterned conductive layer 250 may include a collector electrode of the vertical transistor 200. Details of forming the semiconductor layer 240 and the third patterned conductive layer 250 can be ascertained by referring to the paragraphs described above, and a description in this regard will not be repeated herein.

Through the manufacturing method described above, the vertical transistor 200 can be realized. Compared to a planar transistor, the channel length of the vertical transistor 200 (e.g., the interval between the extended conductive layer 260 and the third patterned conductive layer 250) is determined by the thickness of the semiconductor layer 240, instead of by the capability of the manufacturing machine. Thus, the channel length of the vertical transistor 200 can be effectively shrunk. In addition, compared to some approaches where the insulator layers and the conductive layers are formed by using different materials, the manufacturing process of the vertical transistor 200 can be simplified by utilizing the manufacturing method described above, such that the efficiency of manufacturing the vertical transistor 200 can be increased.

Third Embodiment

In the following paragraphs, another method of manufacturing the vertical transistor 200 is provided. The manufacturing method in this embodiment is substantially similar to the manufacturing method in the second embodiment, and the major difference between the two methods relates to the step of forming the patterned metal layer 230. Thus, a description of similar steps will not be repeated herein.

In this embodiment, the step of forming the patterned metal layer 230 may include three sub-steps.

Referring back to FIG. 2a, in a first sub-step, a metal material layer 230a is formed on the first patterned insulator layer 224. Details of the metal material layer 230a can be ascertained by referring to the second embodiment described above, and a description in this regard will not be repeated herein.

Figure 3A:
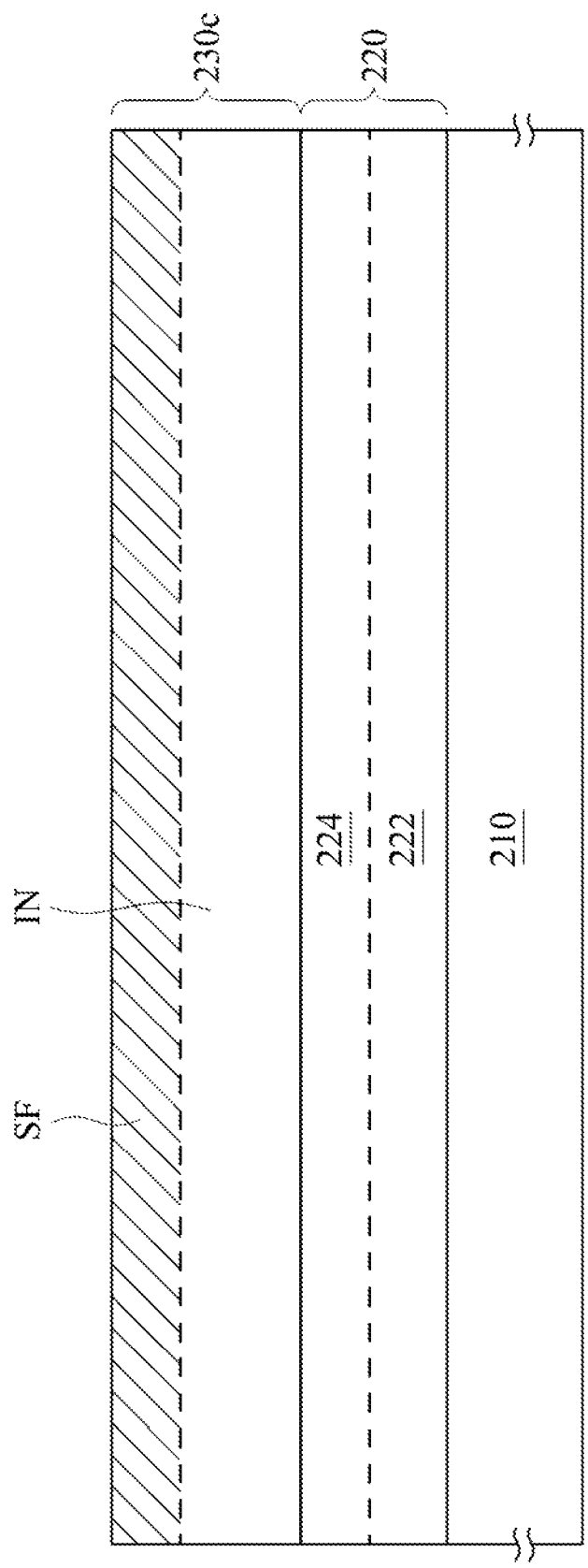
FIGS. 3a to 3b illustrate a manufacturing procedure of a vertical transistor in accordance with a third embodiment of the present disclosure.

Subsequently, referring to FIG. 3a, in a second sub-step, the surface layer SF of the metal material layer 230a is passivated to form a metal material layer 230c having a passivated surface layer SF. The surface layer SF of the metal material layer 230a can be passivated by, for example, using a nitriding or oxidizing process.

Figure 3B:
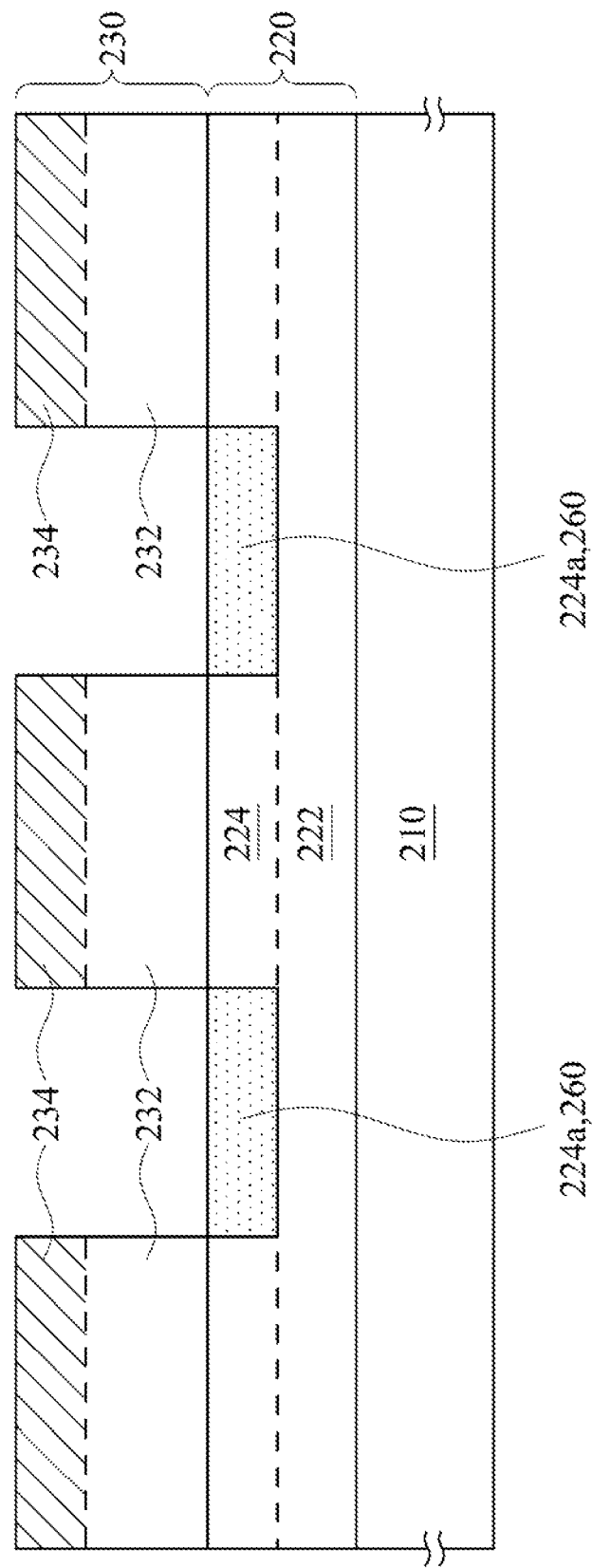

Next, referring to FIG. 3b, in a third sub-step, the metal material layer 230c having the passivated surface layer SF is patterned to form the second patterned conductive layer 232 and the second patterned insulator layer 234, and to expose a corresponding region 224a of the first patterned insulator layer 224. For example, in this sub-step, the second patterned conductive layer 232 is formed by patterning the inner layer IN of the metal material layer 230c, and the second patterned insulator layer 234 is formed by patterning the passivated surface layer SF of the metal material layer 230c.

In addition, during patterning of the metal material layer 230c having the passivated surface layer SF, the oxygen concentration of the corresponding region 224a of the first patterned insulator layer 224 can be decreased. For example, in the third sub-step described above, the metal material layer 230c having the passivated surface layer SF may be dry-etched by plasma. During the process of dry-etching the metal material layer 230c having the passivated surface layer SF, the oxygen concentration of the corresponding region 224a of the first patterned insulator layer 224 is decreased by the plasma, such that the corresponding region 224a of the first patterned insulator layer 224 is converted from an insulator to a conductor and becomes the extended conductive layer 260.

Through the manufacturing method described above, the vertical transistor 200 can be realized in another way. Compared to some approaches where the insulator layers and the conductive layers are formed by using different materials, the manufacturing process of the vertical transistor 200 can be simplified by utilizing the manufacturing method described above, such that the efficiency of manufacturing the vertical transistor 200 can be increased.

In view of the foregoing, one aspect of the present disclosure provides a manufacturing method of the vertical transistor 100/200. The manufacturing method includes the following steps: forming the first patterned conductive layer 120/222 on a substrate 110/210, forming the first patterned insulator layer 132/224 on the first patterned conductive layer 120/222, forming the second patterned conductive layer 134/232 on the first patterned insulator layer 132/224, forming the second patterned insulator layer 136/234 on the second patterned conductive layer 134/232, forming the semiconductor layer 140/240, and forming the third patterned conductive layer 150/250. The semiconductor layer 140/240 is interposed between the first patterned conductive layer 120/222 and the third patterned conductive layer 150/250. In one embodiment, the first patterned insulator layer 132, the second patterned insulator layer 136, and the second patterned conductive layer 134 are made by using a single metal oxide material, and the oxygen concentration of the second patterned conductive layer 134 is different from the oxygen concentrations of the first patterned insulator layer 132 and the second patterned insulator layer 136. In another embodiment, the first patterned conductive layer 222 and the first patterned insulator layer 224 are made by using a single metal oxide material, and the oxygen concentration of the first patterned conductive layer 222 is different from the oxygen concentration of the first patterned insulator layer 224.

By using the manufacturing method described above, the efficiency of manufacturing the vertical transistor 100/200 can be increased.

Another aspect of the present disclosure provides the vertical transistor 100 shown in FIG. 1c. The vertical transistor 100 includes the substrate 110, the first patterned conductive layer 120, the patterned metal oxide layer 130, the semiconductor layer 140, and the third patterned conductive layer 150. The first patterned conductive layer 120 is formed on the substrate 110. The patterned metal oxide layer 130 is formed on the first patterned conductive layer 120. The patterned metal oxide layer 130 includes the first patterned insulator layer 132, a second patterned insulator layer 136, and a second patterned conductive layer 134. The second patterned conductive layer 134 is interposed between the first patterned insulator layer 132 and the second patterned insulator layer 136. The first patterned insulator layer 132, the second patterned insulator layer 136, and the second patterned conductive layer 134 are made by using a single metal oxide material, and the oxygen concentration of the second patterned conductive layer 134 is different from the oxygen concentrations of the first patterned insulator layer 132 and the second patterned insulator layer 136. Details of the vertical transistor 100 can be ascertained by referring to the first embodiment, and a description in this regard will not be repeated herein.

Figure 2D:
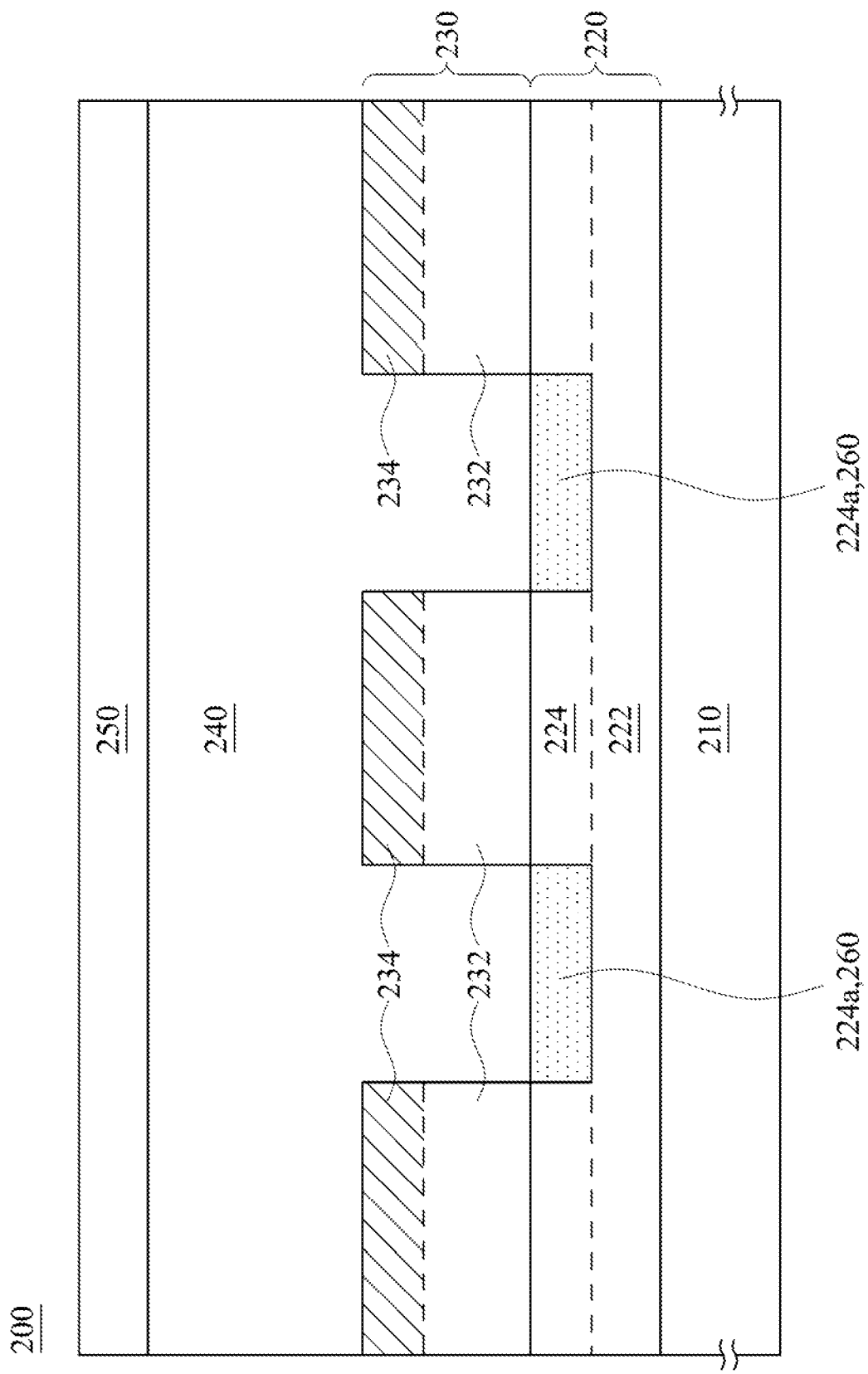

Another aspect of the present disclosure provides the vertical transistor 200 shown in FIG. 2d. The vertical transistor 200 includes the substrate 210, the patterned metal oxide layer 220, the patterned metal layer 230, the semiconductor layer 240, and the third patterned conductive layer 250. The patterned metal oxide layer 220 is formed on the substrate 210. The patterned metal oxide layer 220 includes the first patterned conductive layer 222 and the first patterned insulator layer 224. The patterned metal layer 230 includes the second patterned conductive layer 232 and the second patterned insulator layer 234. The second patterned conductive layer 232 is formed on the first patterned insulator layer 224. The second patterned insulator layer 234 is formed on the second patterned conductive layer 232. The semiconductor layer 240 is interposed between the patterned metal oxide layer 220 and the third patterned conductive layer 250. The first patterned conductive layer 222 and the first patterned insulator layer 224 are made by using a single metal oxide material, and the oxygen concentration of the first patterned conductive layer 222 is different from the oxygen concentration of the first patterned insulator layer 224. Details of the vertical transistor 200 can be ascertained by referring to the first embodiment, and a description in this regard will not be repeated herein.

Although the present invention has been described in considerable detail with reference to certain embodiments thereof, other embodiments are possible. Therefore, the scope of the appended claims should not be limited to the description of the embodiments contained herein.

What is claimed is:

1. A vertical transistor comprising;
    a patterned metal oxide layer formed above a substrate, wherein the patterned metal oxide layer comprises a first patterned conductive layer and a first patterned insulator layer;
    a patterned metal layer formed on the first patterned insulator layer, wherein the patterned metal layer comprises:
        a second patterned conductive layer located on the first patterned insulator layer; and
        a second patterned insulator layer located on the second patterned conductive layer, wherein a width of the second patterned insulator layer is substantially the same with a width of the second patterned conductive layer;
    a semiconductor layer; and
    a third patterned conductive layer, wherein the semiconductor layer is interposed between the patterned metal oxide layer and the third patterned conductive layer;
    wherein the first patterned conductive layer and the first patterned insulator layer are made by using a single metal oxide material, and the oxygen concentration of the first patterned conductive layer is different from the oxygen concentration of the first patterned insulator layer;
    wherein the patterned metal oxide layer further comprises:
        an extended conductive layer formed on the first patterned conductive layer and contacted with the first patterned insulator layer, wherein the extended conductive layer, the first patterned conductive layer and the first patterned insulator layer are made by using the same metal oxide material, the oxygen concentration of the extended conductive layer is lower than the oxygen concentration of the first patterned insulator layer, and pattern of the extended conductive layer is different from pattern of the first patterned conductive layer;

wherein the oxygen concentration of the first patterned insulator layer is substantially greater than 5%, and the oxygen concentration of the first patterned conductive layer is substantially larger than 0% and not larger than 2%.

\* \* \* \* \*